United States Patent
Kang et al.

(10) Patent No.: US 9,024,402 B2
(45) Date of Patent: May 5, 2015

(54) WAVEGUIDE AVALANCHE PHOTODETECTORS

(75) Inventors: Yimin Kang, San Jose, CA (US);
Zhihong Connie Huang, Santa Clara, CA (US); Han-Din Dean Liu, San Jose, CA (US); Yuval Saado, Qiriyat Gat (IL); Yun-Chung Neil Na, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/695,553

(22) PCT Filed: Nov. 2, 2011

(86) PCT No.: PCT/US2011/058970
§ 371 (c)(1),
(2), (4) Date: Oct. 31, 2012

(87) PCT Pub. No.: WO2013/066325
PCT Pub. Date: May 10, 2013

(65) Prior Publication Data
US 2014/0231946 A1 Aug. 21, 2014

(51) Int. Cl.
| | |
|---|---|
| H01L 31/0232 | (2014.01) |
| H01L 31/107 | (2006.01) |
| H01L 29/732 | (2006.01) |
| H01L 31/0328 | (2006.01) |
| H01L 31/0336 | (2006.01) |
| H01L 31/072 | (2012.01) |
| H01L 31/109 | (2006.01) |
| H01L 31/028 | (2006.01) |

(52) U.S. Cl.
CPC ........ *H01L 31/02327* (2013.01); *H01L 31/107* (2013.01); *H01L 31/028* (2013.01)

(58) Field of Classification Search
USPC .......................... 257/186, 432, 438, E31.063
See application file for complete search history.

(56) References Cited

U.S. PATENT DOCUMENTS

| | | | | |
|---|---|---|---|---|
| 4,990,990 | A | * | 2/1991 | Albrecht et al. ............... 257/290 |
| 5,619,521 | A | * | 4/1997 | Tanaka ........................ 372/50.21 |
| 5,689,122 | A | * | 11/1997 | Chandrasekhar .............. 257/184 |
| 5,747,860 | A | * | 5/1998 | Sugiyama et al. ............ 257/432 |
| 5,926,585 | A | * | 7/1999 | Irikawa et al. ................... 385/14 |
| 6,538,299 | B1 | | 3/2003 | Kwark et al. |

(Continued)

FOREIGN PATENT DOCUMENTS

| | | |
|---|---|---|
| CN | 1164933 A | 11/1997 |
| WO | 2013/066325 A1 | 5/2013 |

OTHER PUBLICATIONS

International Search Report and Written Opinion Received for PCT Application No. PCT/US2011/058970, Mailed on Aug. 7, 2012, 9 pages.

(Continued)

*Primary Examiner* — Ida M Soward

(57) ABSTRACT

Devices comprised of end-on waveguide-coupled photodetectors are described. In embodiments of the invention, the photodetectors are avalanche photodiodes coupled end-on to a waveguide. The waveguide includes an insulating trench proximate to the coupled photodetector. In embodiments of the invention, the avalanche photodiodes are silicon/germanium avalanche photodiodes.

20 Claims, 7 Drawing Sheets

(56) References Cited

U.S. PATENT DOCUMENTS

| | | | |
|---|---|---|---|
| 7,075,165 B2 * | 7/2006 | Leon et al. | 257/458 |
| 7,224,858 B2 * | 5/2007 | Welch et al. | 385/14 |
| 7,397,101 B1 * | 7/2008 | Masini et al. | 257/458 |
| 7,453,132 B1 * | 11/2008 | Gunn et al. | 257/448 |
| 7,521,737 B2 * | 4/2009 | Augusto | 257/233 |
| 7,529,435 B2 * | 5/2009 | West et al. | 385/14 |
| 7,583,869 B2 * | 9/2009 | Kang et al. | 385/14 |
| 7,683,397 B2 | 3/2010 | Sarid et al. | |
| 7,972,922 B2 * | 7/2011 | Martinez et al. | 438/226 |
| 2004/0188794 A1 | 9/2004 | Gothoskar et al. | |
| 2011/0027950 A1 * | 2/2011 | Jones et al. | 438/155 |
| 2012/0126286 A1 | 5/2012 | Na et al. | |
| 2013/0004119 A1 | 1/2013 | Yin et al. | |

OTHER PUBLICATIONS

Sheng, Zhen et al. "InGaAs PIN photodetectors integrated on Silicon-on-insulator waveguides," Optical Society of America, Jan. 18, 2010, vol. 18, No. 2, pp. 1756-1761.

Kang, Yimin, et al. "Monolithic Germanium/Silicon Avalanche Photodiodes with 340 GHz Gain—Bandwidth Product," Nature Photonics, Published on line Dec. 7, 2008, DOI: 10.1038/NPHOTON2008.247.

International Preliminary Report on Patentability received for PCT Patent Application No. PCT/US2011/058970, mailed on May 15, 2014, 4 pages.

Office Action Received for Taiwanese Patent Application No. 101140313, mailed on Dec. 4, 2014, 5 Pages of Taiwanese Office Action and 6 Pages of English Translation.

* cited by examiner

WAVEGUIDE AVALANCHE PHOTODETECTORS

RELATED MATTERS

This application claims priority to PCT/US2011/058970, flied on Nov. 11, 2011.

BACKGROUND OF THE INVENTION

1. Field of the Invention

The embodiments of the invention relate generally to optical communication and data transfer, optical interconnects, photodetectors, avalanche photodiodes, silicon photonics, and integrated circuits.

2. Background Information

Data transmission and communication using optical-based technologies offers advantages over standard electrical conductor-based systems, such as higher rates of data transmission. Lasers can be used to produce the light (electromagnetic radiation) on which data may be encoded and transmitted. The light, produced by a laser can be, for example, electromagnetic radiation in the infrared, visible, ultraviolet, or X-ray region of the electromagnetic spectrum. Silicon-based optics typically use light in the infrared region. For high rates of data transmission, data is encoded using a plurality of wavelengths of light which are then multiplexed together, sent to an input device, demultiplexed, and detected at a photodetector. Optical data transmission is useful, for example, inside and around personal computers, servers, and data centers as well as more long-range data transmission and communication activities.

BRIEF DESCRIPTION OF THE FIGURES

FIG. 2 illustrates a structure for an avalanche photodiode useful in embodiments of the invention.

DETAILED DESCRIPTION OF THE INVENTION

Waveguide photodetectors can provide high bandwidth and high responsivity, properties that are desirable in high speed optical communication links. It was discovered, however, that waveguide photodetectors that are monolithically integrated with a semiconductor waveguide on the same planar level (i.e., end-on coupled photodetectors) suffer from device performance deterioration issues. A cause of device performance deterioration was discovered to be a carrier leakage path formed at the waveguide/photodetector interface. Embodiments of the present invention provide devices capable of reducing the effect of the carrier leakage path. Devices according to embodiments of the invention are capable of reducing the carrier leakage path without compromising the optical performance of the device.

Avalanche photodiodes (APDs) are sensitive semiconductor photodetectors. APDs are used, for example, in applications where high sensitivity is desired, such as, long haul fiber-optic telecommunication, laser rangefinders, and single photo level detection and imaging. APDs formed from silicon and germanium can provide devices capable of detecting near-infrared optical signals. In a silicon/germanium separate absorption charge multiplication (SACM) APD, germanium provides high responsivity at near-infrared wavelengths while silicon is capable of amplifying the generated photocarriers with low noise. Other materials APDs and SACM APDs can be formed from include, for example, materials comprising elements from groups III and V (3A and 5A) of the periodic table, such as, InGaAs, InGaAsP, and InP, and combinations thereof.

Figure 1A:
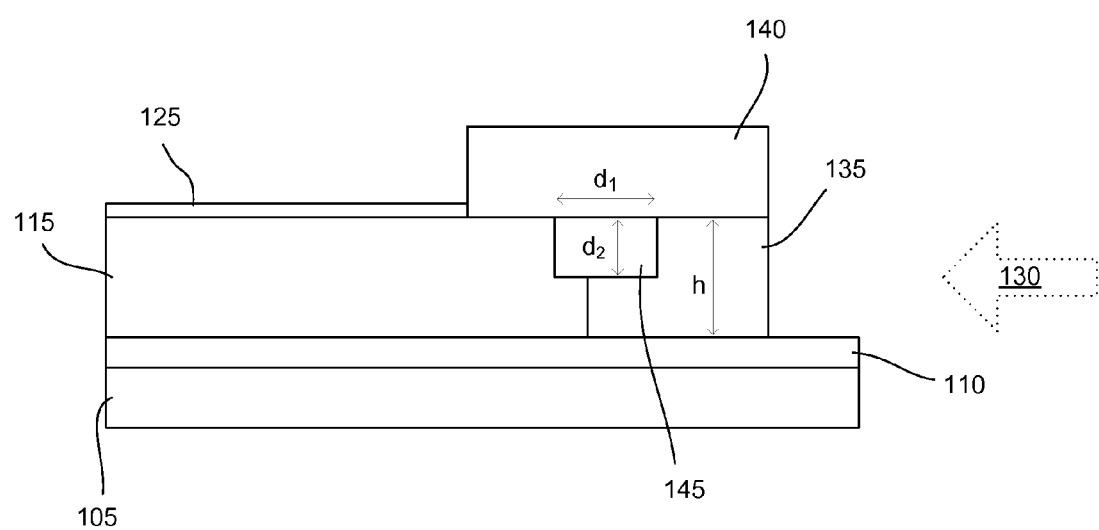
FIGS. 1A-B are schematic diagrams illustrating cross-sectional views of an avalanche photodiode coupled to a silicon waveguide.
Figure 1B:
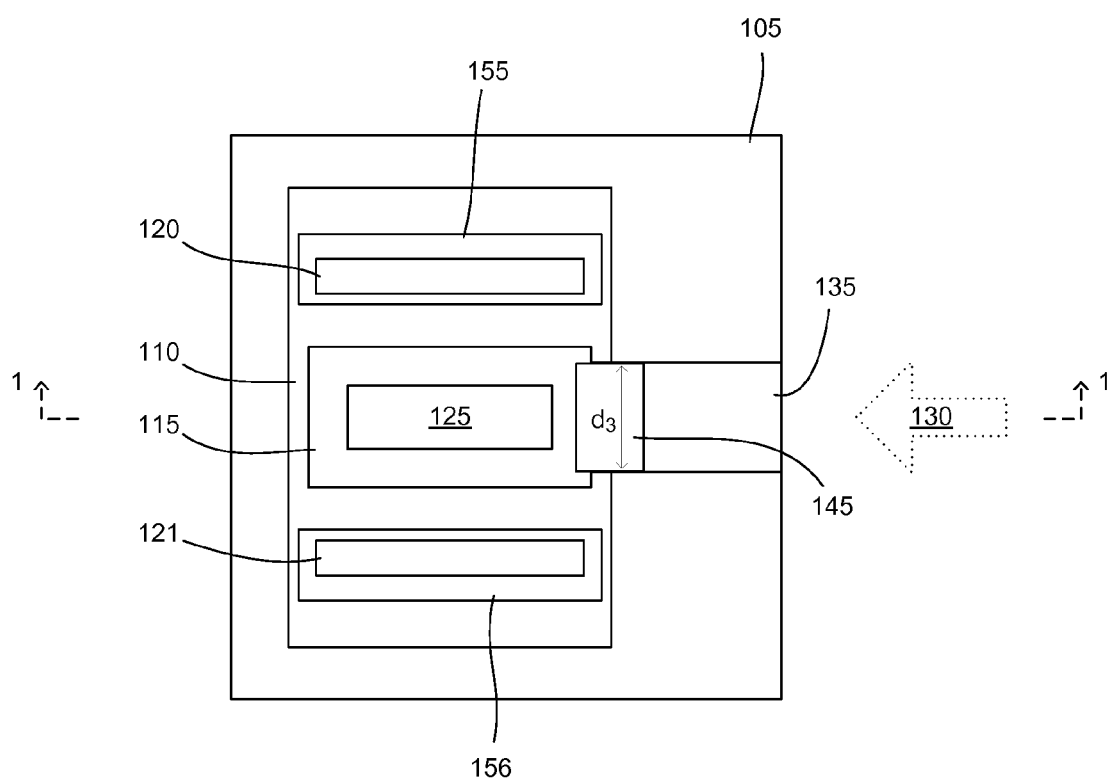

FIGS. 1A-B illustrate an avalanche photodiode coupled to an end-region of a silicon waveguide. FIG. 1A shows a side-view through the line 1-1 of FIG. 1B. In FIGS. 1A-B, a substrate 105 houses a coupling layer 110 that electrically connects avalanche photodiode 115 to first electrical contacts 120 and 121. The substrate is an insulating material or comprises an insulating layer in contact with coupling layer 110. A second electrical contact 125 connects to avalanche photodiode 115. Electrical contacts 120, 121, and 125 are used to electrically connect the photodetector 115 into a monolithic photodetector circuit (not shown) or a separate receiver IC chip (not shown) through, for example, wire bonding or flip-chip bonding. The photodetector 115 directly contacts an end of the waveguide 135. Incoming light 130 enters waveguide 135, travels to photodetector 115, and is converted to an electrical signal by photodetector 115. A passivation layer 140 is interposed between the second electrical contact 125 and the waveguide 135. (Passivation layer 140 is omitted in FIG. 1B for clarity of illustration.) An insulating trench 145 in waveguide 135 is provided to block current leakage through the waveguide 135 and between the second electrode 125 and the first electrodes 120 and 121.

In FIG. 1B, electrical contacts 120 and 121 abut coupling layer 110 which electrically connects the electrical contacts 120 and 121 to the photodetector 115. Coupling layer 110 optionally additionally comprises interior contact regions 155 and 156, that are interposed between electrical contacts 120 and 121 and coupling layer 110 and that electrically connect the electrical contacts 120 and 121 to the coupling layer. Coupling layer 110 is comprised of, for example, silicon and contact regions 155 and 156 are comprised of, for example, silicon.

In embodiments of the invention, the dimensions of the insulating trench 145 are $d_2$ between and including, 0.05 and 0.5 µm, 0.1 µm and 0.5 µm, or 0.1 µm and 0.4 µm, and or $d_3$ is the same width as the waveguide 135 or wider than the width of the waveguide 135. The dimension $d_1$ is generally small and can be as small as manufacturing tolerances allow depending on the choice of insulating material for insulating trench 145, although larger values are also acceptable. In embodiments of the invention, $d_1$ is between and including 0.005 µm to 0.5 µm. In general, $d_1$ is the length and is a dimension that is parallel to the direction that the optical signal propagates through the waveguide and into the avalanche photodiode and $d_2$ is the depth and is a dimension that is parallel to an interface between the waveguide and the avalanche photodiode, and $d_3$ is the width of the insulating trench 145. In general, other values for the dimensions of the insulating trench 145 are possible as determined at least in part by the dimensions of and type of photodetector and the layer structure of the photodetector employed. In general, $d_2$ is a dimension affecting both the optical loss and electrical isolation. If $d_2$ is shallow, then the electrical isolation will be poorer but optical attenuation will be smaller. If $d_2$ is deep, then the electrical isolation will be better but optical attenuation will be larger.

The insulating trench 145 can be comprised of an insulating material, such as a proton implant region in the waveguide, $SiO_2$, silicon nitride, silicon oxynitride, or a region comprised of another material that is insulating. The waveguide 135 can be comprised or, for example, silicon. The electrical contacts 120, 121, and 125 are comprised, of a conductive material, such as for example tungsten (W), aluminum (Al), copper (Cu), and or another conducting material.

Figure 2:
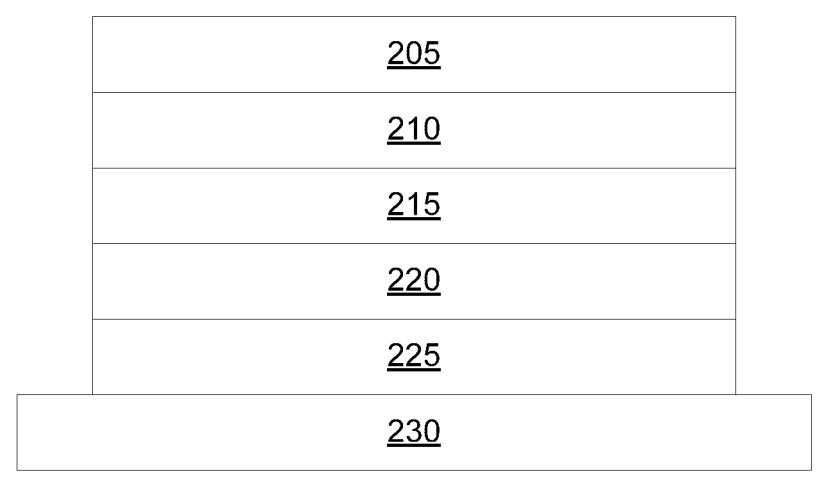

In an embodiment of the invention, the photodetector 115 is an APD comprised of silicon and germanium. FIG. 2 shows a structure for a silicon/germanium avalanche photodiode. Other designs for silicon/germanium photodetectors are also possible, including different layers, layer compositions layer depths, and doping concentrations. It is also possible to use an APD or other photodetector comprised of different materials in embodiments of the invention. In FIG. 2, a silicon/germanium APD is comprised of layers of material including a P+ contact layer 205, that is comprised, for example, of highly doped p-type germanium, an absorption region 210 is comprised, for example, of undoped germanium, a charge layer 215 is comprised of for example, p-type silicon, a multiplication region 220 comprised, for example, of undoped silicon, and a N+ contact layer 225 comprised of highly doped n-type silicon, and layer 230 is a high-resistance layer, such as a $SiO_2$, SiN, or a siliconoxynitride layer or a layer of other insulating material. In alternate embodiments, the doping types of the APD structure described with respect to FIG. 2 can be inverted so that the p-type regions are changed to n-type, and vice versa. The embodiment chosen can depend, for example, on the kinds of materials chosen to build other components of the system into which the avalanche photodiode is integrated. Also, in embodiments of the invention, contact layer 225 is the same layer as coupling layer 110 in FIGS. 1A-B. Doped layers of materials can also be inhomogeneous and comprised, for example, of layers of material having varying doping concentrations.

Figure 3:
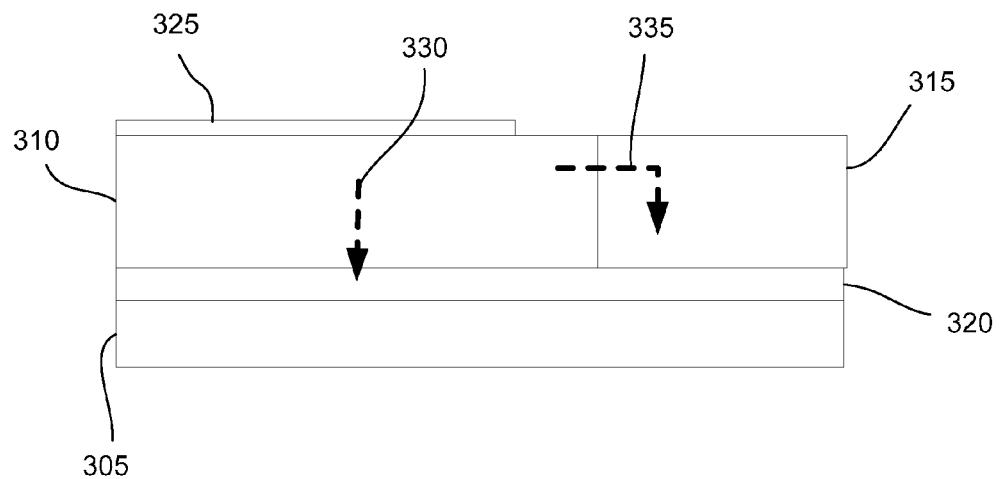
FIG. 3 illustrates a current leakage path in a structure comprising an avalanche photodiode and a waveguide.

FIG. 3 illustrates a current leakage path that was discussed with respect to FIGS. 1A-B. It was discovered that a current leakage path existed in a structure comprising a photodetector coupled end-on to a semiconductor waveguide. It is believed that unintentional background doping of the waveguide allows the waveguide to become conductive enough to provide a current leakage path illustrated in FIG. 3. In FIG. 3 a substrate 305 houses a photodetector 310 that is in contact with an end of a waveguide 315. Coupling layer 320 is between substrate 305 and photodetector 310. A first electrical contact 325 makes electrical contact with photodetector 310 and is part of a desired current path through the photodetector 310 shown as arrow 330. An undesired current leakage path, shown as arrow 335, was also found to exist. It was found through device simulation that a designed insulating trench 145 according to FIGS. 1A-B can be capable of substantially blocking the current leakage path while also allowing light to enter the photodetector 310 from waveguide 315.

Figure 4:
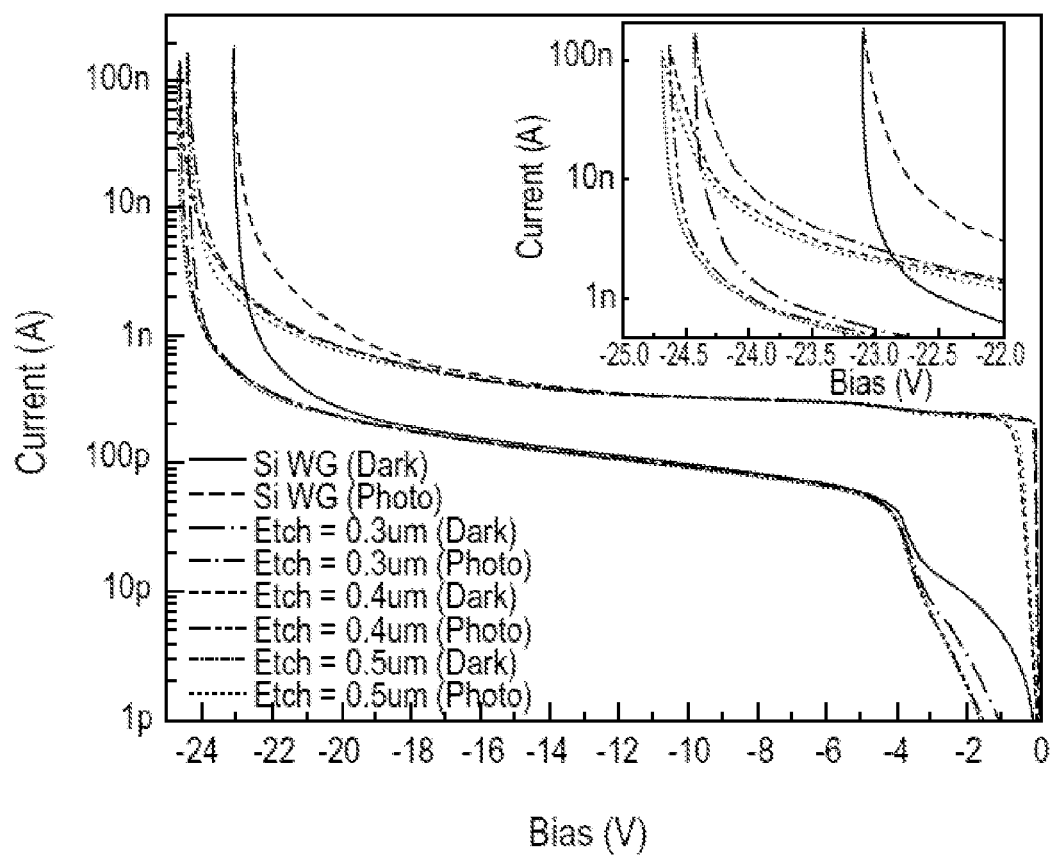
FIG. 4 shows a graph of the simulated current-voltage characteristics of devices comprising a silicon/germanium avalanche photodiode coupled end-on to a silicon waveguide.

FIG. 4 provides a graph of the simulated current-voltage (I-V) characteristics of a silicon/germanium APD coupled end-on to a silicon waveguide. Plated data shows an example of an APD coupled end-on with the waveguide without the insulating trench 145 of FIGS. 1A-B (lines labeled "Si WG (Dark)/(Photo)") and with 1 μm long $SiO_2$ trenches (according to FIGS. 1A-B). The $SiO_7$ trenches were varied from a depth of 0.3 μm to 0.5 μm (lines labeled "Etch=0.3 μm–0.5 μm (Dark)/(Photo)"). The inset plots the near breakdown I-V characteristics, demonstrating that the breakdown voltage increases as the $SiO_2$ trench deepens. The breakdown voltage increased by about 1.6 V with a 0.5 μm deep trench in the Si waveguide. The increased device breakdown voltage is an important indication of the blockage of the current leakage path. Data was plotted using TCAD (technology computer aided design) simulation software from Sentaurus.

Figure 5:
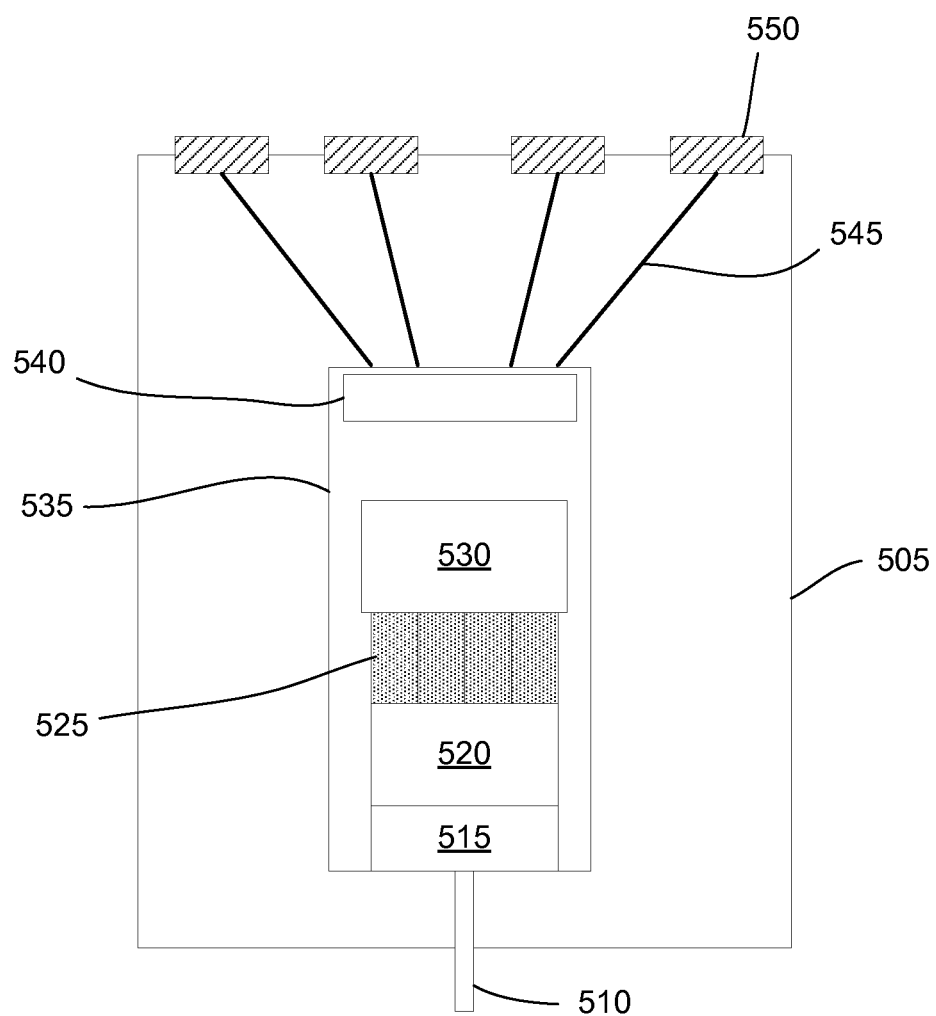
FIG. 5 schematically illustrates a device for converting an incoming optical signal into an electrical signal.

FIG. 5 shows an embodiment of an optical transceiver for converting an incoming optical signal to an electrical signal. The optical transceiver of FIG. 5 is useful, for example, as part of an optical data transmission system, a computer system, a computing device, and the system of FIG. 6. It should be noted, however, that the optical transceiver of FIG. 5 is only one of many possible ways to deploy the photodetector devices described herein. Further, other configurations are also possible for the components within the optical transceiver. In FIG. 5, the components of the optical transceiver system are housed on board 505. An optical signal enters the transceiver through waveguide 510. The waveguide 510 is, for example, an optical fiber. The waveguide 510 is optionally optically coupled to a lens region 515 which focuses an incoming optical beam in at least one dimension. The lens region 515 is optically coupled to a demultiplexing region 520 which is capable of splitting an incoming optical beam into data-carrying component wavelengths. The component light beams are directed into waveguides not shown) which couple to photodetectors 525. In this embodiment, four photodetectors 525 are shown, although other numbers are possible. Photodetectors 525 are, in an embodiment of the invention, avalanche photodiodes coupled end-on to a waveguide and the waveguide comprises an insulating trench such as described with respect to FIGS. 1A-B. Output from the four photodetectors 525 enters the conversion module 530 which converts the signal from the photodetectors 525 (current signal) into signal that can be used by other devices (amplified voltage signal). In embodiments of the invention, the conversion module 530 is a trans-impedance amplifier (TIA). The TIA converts the current signal from each photodetector into a voltage signal and amplifies it. The gain is called the trans-impedance gain. The lens region 515, demultiplexing region 520, photodetectors 525, and conversion module 530 are optionally built on a semiconductor chip which is then packaged (packaged semiconductor chip 535) to include coupler 540 which couples output electronic signals from conversion module 530 to board 505. The conversion module 530 converts each electrical signal from each photodetector 525 into a separate signal each of which is output through coupler 540. In this embodiment, board 505 includes metal traces 545 which are electrically coupled to electrical connectors 550. The metal traces 545 are coupled to an input coupler (not shown) attached to the board 505. The input coupler couples with coupler 540 and routes the four (in this example) electrical signals from the conversion module so that each signal is routed to one of the traces 545. Electrical connectors 550 are plugs or sockets, for example. Electrical connectors 550 are capable of connecting with other elements of a computing system. Other configurations are also possible for units that convert optical to electrical signal. For example, other configurations can include, for example, various waveguides, splitters, gratings, and rings, and any possible passive devices before the photodetectors 525.

Figure 6:
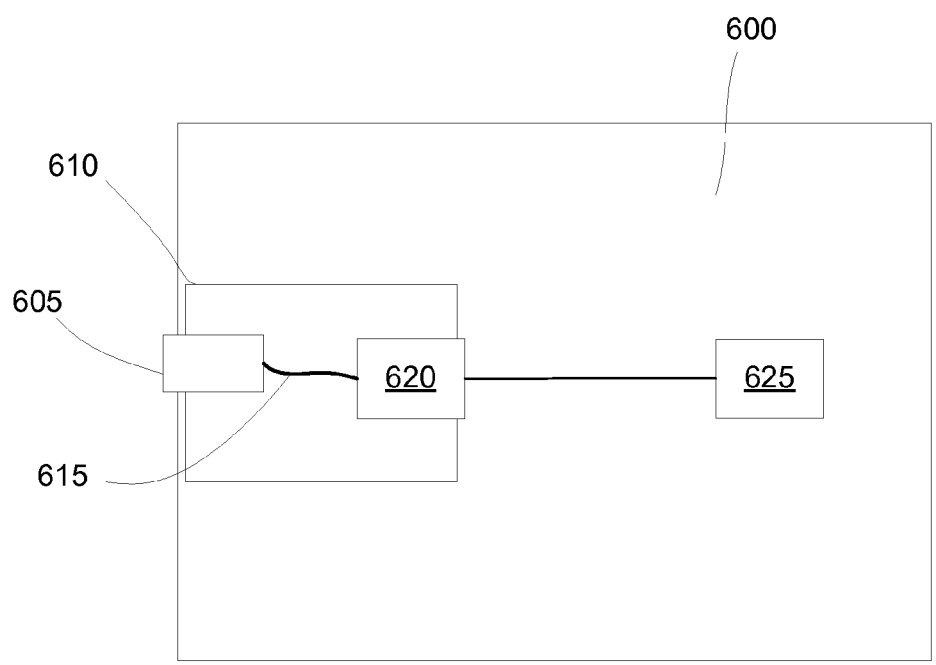
FIG. 6 schematically illustrates a computing system that has optical data input capabilities.

FIG. 6 illustrates schematically a system for data input into a computing system. In FIG. 6, a computing system 600 comprises optical receiver plug receptacle 605 mounted on a board 610 and optically connected through optical waveguides 615 to an optical transceiver 620. Although, one optical receiver plug receptacle 605 is shown in FIG. 6, other numbers are possible. The optical receiver plug receptacle 605 is capable of coupling with an optical plug (not shown) and optionally also include the ability to transfer power and or input electrical data. The optical receiver plug and plug receptacle 605 optionally conform to a data transfer standard, such as for example, USB (universal serial bus), firewire, HDMI (high definition multimedia interface), SCSI (small computer system interface), PCIe (peripheral component interconnect express), and SPI (serial peripheral interface bus). The optical transceiver 620 is capable of transforming an incoming optical signal to an electrical signal. In an embodiment of the invention, the optical transceiver 620 comprises at least one avalanche photodiodes coupled end-on to a waveguide and the waveguide comprises an insulating trench such as described with respect to FIGS. 1A-B. Optionally, the optical transceiver 620 also comprises an optical demultiplexer (not shown). Optical signal enters the optical transceiver 620, is focused into a waveguide having a smaller dimension by a lens, and is detected by the photodetector. Optionally, the optical signal is demultiplexed before it is detected by the photodetector. The electrical signal from the photodetector is optionally amplified and transmitted to computer subsystem 625. The computer subsystem 625 is, for example, a CIO router (converged input/output for converting optical and electrical signal into one input/output), a platform controller hub, a chipset, a chipset that controls and routes the different types of information flowing into and out of a CPU (central processing unit), a processor, and or a memory device. Data input through the optical transceiver 620 is routed to one or more processors. A computing system is for example, a server, a computer, a portable computing device, a telephone, a scanner, a camera, a monitor, a remote memory device, a HDTV (high definition television), or a television. The waveguide photodetectors are also useful in other optical communication links. For example, an optical transceiver can be used in the communication between processor and memory and can potentially provide higher data rates than what is typically achieved with an electrical interconnect.

Typically a computer, a portable computing device, or other device comprising a processor, has a processing system, including a processor that is communicatively coupled to one or more volatile or non-volatile data storage devices such as random access memory (RAM), read-only memory (ROM), mass storage devices such as serial advanced technology attachment (SATA) or small computer system interface hard drives, and or devices capable of accessing media, such as floppy disks, optical storage, tapes, flash memory, memory sticks, CD-ROMs and or digital video disks (DVDs). The term ROM refers to non-volatile memory devices such as erasable programmable ROM (EPROM), electrically erasable programmable ROM (EEPROM), flash ROM, and or flash memory. The processor may also be communicatively coupled to additional components, such as video controllers, SCSI controllers, network controllers, universal serial bus (USB) controllers, and input devices. Communications between elements of the computer system, additional processors, and or the electrical usage monitors can occur using various wired and or wireless short range protocols including, USB, WLAN (wireless local area network), radio frequency (RF), satellite, microwave, Institute of Electrical and Electronics Engineers (IEEE) 802.11, Bluetooth, optical, fiber optical, infrared, cables, and lasers.

In general, an integrated circuit chip is also known as a microchip, a silicon chip, or a chip. A plurality of IC chips are typically built on a semiconductor wafer (a thin silicon disk, having a diameter, for example, of 300 mm) and after processing the wafer is diced apart to create individual chips. The waveguide photodetectors according to embodiments of the invention can be build on an integrated circuit chip comprising, among other things, electronics to receive and amplify output from the photodetectors.

The substrate on which the devices according to embodiments of the invention are built is, for example, a semiconductor wafer, such as a silicon wafer or a silicon-on-insulator substrate. Silicon wafers are substrates that are typically used in the semiconductor processing industry although embodiments of the invention are not dependent on the type of substrate used. The substrate could also be comprised of germanium, indium antimonide, lead telluride, indium arsenide, indium phosphide, gallium arsenide, gallium antimonide, and or other Group III-V materials either alone or in combination with silicon or silicon dioxide or other insulating materials. One or more graded-index lenses and associated optical devices and electronics can be built on the substrate surface. Additionally, the substrate optionally houses electronics that are capable of performing or assisting in the performance of computing functions, such as data input data transformation from optical to electronic form, data processing, data output, and or data storage.

Embodiments of the invention are capable of being built using standard semiconductor processing techniques as are known in the art of semiconductor manufacturing. Advantageously, devices according to embodiments of the invention are capable of being integrated with silicon-based semiconductor devices and manufactured with silicon-based semiconductor manufacturing techniques.

Persons skilled in the relevant art appreciate that modifications and variations are possible throughout the disclosure and substitutions for various components shown and described are possible. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, and characteristics disclosed in the embodiments may be combined in any suitable manner in one or more embodiments. Various additional layers and/or structures may be included and/or described features may be omitted in other embodiments.

We claim:

1. A device comprising,
   a substrate,
   a semiconductor waveguide disposed on the substrate, and
   a photodetector optically coupled directly to the waveguide
      wherein the photodetector is capable of converting an optical signal received from the waveguide into an electrical signal and wherein there is an interface between the photodetector and the waveguide where the photodetector and the waveguide are optically coupled, and
   an insulating trench comprising a region of insulating material wherein the insulating trench is in the interface where the photodetector and the waveguide are coupled.

2. The device of claim 1 wherein the photodetector is comprised of silicon and germanium.

3. The device of claim 1 wherein the photodetector is an avalanche photodiode.

4. The device of claim 1 wherein the waveguide is comprised of silicon.

5. The device of claim 1 wherein the insulating trench is comprised of a proton implant region in the waveguide, $SiO_2$, silicon nitride, or silicon oxynitride.

6. The device of claim 1 wherein the insulating trench has a length wherein the length is a dimension that is parallel to the direction that the optical signal propagates through the waveguide and into the photodiode and the length is between and including 0.005 μm to 0.5 μm.

7. The device of claim 1 wherein the insulating trench and the waveguide have a depth wherein the depth is a dimension that is parallel to the interface between the waveguide and the photodiode, and the depth of the insulating trench is between and including 0.05 μm to 0.5 μm.

8. The device of claim 1 wherein the insulating trench and the waveguide have a depth wherein the depth is a dimension that is parallel to the interface between the waveguide and the photodiode, and the depth of the insulating trench is between and including 0.1 μm to 0.4 μm.

9. The device of claim 1 additionally including electrical contacts coupled the photodiode wherein the photodiode comprises a layered structure, a first electrical contact is located on a first end layer of the photodiode, a second and third electrical contacts are located on a contact layer that extends out from a second end layer opposite to the first end layer of the photodiode.

10. The device of claim 1 wherein the insulating trench is recessed into the waveguide.

11. A device comprising,
a processor and an optical data input module wherein the processor is operably coupled to and able to receive data from the optical data input module, wherein an optical signal input into the optical data input module is capable of being converted to an electrical signal by the optical data input module, and wherein the optical data input module comprises:
a substrate,
a semiconductor waveguide disposed on the substrate, and
a photodetector optically coupled directly to the waveguide wherein the photodetector is capable of converting an optical signal received from the waveguide into an electrical signal and wherein there is an interface between the photodetector and the waveguide where the photodetector and the waveguide are optically coupled, and
an insulating trench comprising a region of insulating material wherein the insulating trench is in the interface where the photodetector and the waveguide are optically coupled.

12. The device of claim 11 wherein the photodetector is comprised of silicon and germanium.

13. The device of claim 11 wherein the photodetector is an avalanche photodiode.

14. The device of claim 11 wherein the waveguide is comprised of silicon.

15. The device of claim 11 wherein the insulating trench is comprised of a proton implant region in the waveguide, $SiO_2$, silicon nitride, or silicon oxynitride.

16. The device of claim 11 wherein the insulating trench has a depth wherein the depth is a dimension that is parallel to the interface between the waveguide and the photodiode and the depth is between and including 0.05 μm to 0.5 μm.

17. The device of claim 11 wherein the insulating trench has a depth wherein the depth is a dimension that is parallel to the interface between the waveguide and the photodiode and the depth is between and including 0.1 μm to 0.4 μm.

18. The device of claim 11 wherein the insulating trench has a length wherein the length is a dimension that is parallel to the direction that the optical signal propagates through the waveguide and into the photodiode and the length is between and including 0.005 μm to 0.5 μm.

19. The device of claim 11 additionally including electrical contacts coupled the photodiode wherein the photodiode comprises a layered structure, a first electrical contact is located on a first end layer of the photodiode, a second and third electrical contacts are located on a contact layer that extends out from a second end layer opposite the first end layer of the photodiode.

20. The device of claim 11 wherein the trench is recessed into the waveguide.

* * * * *

UNITED STATES PATENT AND TRADEMARK OFFICE
CERTIFICATE OF CORRECTION

| | |
|---|---|
| PATENT NO. | : 9,024,402 B2 |
| APPLICATION NO. | : 13/695553 |
| DATED | : May 5, 2015 |
| INVENTOR(S) | : Yimin Kang et al. |

It is certified that error appears in the above-identified patent and that said Letters Patent is hereby corrected as shown below:

In the Specification

Please insert:

In column 1, line 8, before BACKGROUND OF THE INVENTION,

--STATEMENT OF GOVERNMENT INTEREST

This invention was made with Government support under contract number H98230-08-3-0011 awarded by the Department of Defense. The Government has certain rights in this invention.--

Signed and Sealed this
Fifth Day of April, 2016

Michelle K. Lee
*Director of the United States Patent and Trademark Office*